United States Patent
Cho et al.

(10) Patent No.: US 8,212,576 B1
(45) Date of Patent: Jul. 3, 2012

(54) METHOD AND APPARATUS FOR SELF-REGULATED BURN-IN OF AN INTEGRATED CIRCUIT

(75) Inventors: Jae Cho, Saratoga, CA (US); Glenn O'Rourke, San Juan Bautista, CA (US); Michael M. Matera, Santa Cruz, CA (US); Jongheon Jeong, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 338 days.

(21) Appl. No.: 12/606,101

(22) Filed: Oct. 26, 2009

(51) Int. Cl.
*G01R 31/00* (2006.01)

(52) U.S. Cl. ......... 324/750.01; 324/750.05; 324/750.06; 324/750.07

(58) Field of Classification Search .................. None
See application file for complete search history.

(56) References Cited

U.S. PATENT DOCUMENTS 5,359,285 A * 10/1994 Hashinaga et al. ...... 324/750.07
6,900,650 B1 * 5/2005 Sheng et al. ............. 324/750.07

OTHER PUBLICATIONS

Xilinx, Inc., UG192, "Virtex- 5 FPGA System Monitor User Guide", v1.7, Mar. 11, 2009, pp. 1-66, available from Xilinx, Inc., 2100 Logic Drive, San Jose, California 95124.

* cited by examiner

*Primary Examiner* — Vinh Nguyen
(74) *Attorney, Agent, or Firm* — Robert M. Brush (57) ABSTRACT

Method and apparatus for self-regulated burn-in of an integrated circuit (IC) is described. One embodiment of a method of burn-in for the IC includes: configuring programmable resources of the IC device based on a burn-in pattern to implement a load controller, the load controller having a plurality of heat core circuits. The load controller is initialized with a number of enabled heat core circuits of the plurality of heat core circuits. A junction temperature is measured in the IC device after a measurement period has elapsed. The junction temperature is compared with a set-point temperature. The number of the enabled heat core circuits is increased if the junction temperature is less than the set-point temperature, or the number of the enabled heat core circuits is decreased if the junction temperature is greater than the set-point temperature.

20 Claims, 4 Drawing Sheets

FIG. 6

METHOD AND APPARATUS FOR SELF-REGULATED BURN-IN OF AN INTEGRATED CIRCUIT

FIELD OF THE INVENTION

One or more embodiments of the present invention relate generally to integrated circuits and, more particularly, to a method and apparatus for self-regulated burn-in of an integrated circuit (IC).

BACKGROUND OF THE INVENTION

Testing is an important step in the production of semiconductor devices. One type of test is referred to as a High Temperature Operating Lifetime (HTOL) test. IC manufacturers can use HTOL testing to evaluate reliability of their devices and to guarantee that their devices are capable of operating at a desired performance level over a defined period of time (e.g., 10 years). In HTOL testing, IC devices are operated under a higher junction temperature (Tj) than the maximum allowable junction temperature for normal usage of the IC devices by customers. "Junction temperature" is defined as the temperature of the actual semiconductor die of an IC. Operating the devices under a higher junction temperature accelerates the reliability mechanism used to assess reliability of the IC devices up to an end of lifetime within a reasonable test time.

A conventional technique for HTOL testing involves testing IC devices in a "burn-in" chamber. The ambient temperature of the "burn-in" chamber is controlled using hot air flow to elevate the junction temperatures of the IC devices beyond their maximum specified junction temperatures while the IC devices are electrically tested. However, this method of testing does not provide for precise control of temperature, since the temperature in the "burn-in" chamber may fluctuate by plus/minus five degrees Celsius throughout the burn-in test. Furthermore, due to the nature of modern semiconductor fabrication and assembly process, device-to-device variation among the IC devices can result in a wide range in power consumption across the different IC devices being tested. A "burn-in" chamber does not compensate for such variations among IC devices being tested and thus IC devices are stressed with different junction temperatures based on their individual levels of power consumption. The aforementioned temperature control problems can result in a significant increase to the risk of having destructive thermal run-away during burn-in. Further, the temperature control problems deteriorate the accuracy of the test results.

Another problem with conventional burn-in testing is the inaccuracy added to the test results due to the junction temperature being estimated either based on power consumption of the ICs under test or temperature of the IC packages. In either case, the junction temperature (i.e., the temperature of the IC die) is not directly measured. Thus, a junction-to-ambient or junction-to-case thermal resistance must be characterized independently from the burn-in test in order to derive a measurement of junction temperature. A small error in thermal resistance used in the calculation can translate to a significant error in test results.

Accordingly, there exists a need in the art for an improved method and apparatus for burn-in of an IC.

SUMMARY OF THE INVENTION

One embodiment of a method for burn-in of an integrated circuit (IC) device includes: configuring programmable resources of the IC device based on a burn-in pattern to implement a load controller, the load controller having a plurality of heat core circuits. The load controller is initialized with a number of enabled heat core circuits of the plurality of heat core circuits. A junction temperature is measured in the IC device after a measurement period has elapsed. The junction temperature is compared with a set-point temperature. The number of the enabled heat core circuits is increased if the junction temperature is less than the set-point temperature, or the number of the enabled heat core circuits is decreased if the junction temperature is greater than the set-point temperature.

In this embodiment, the burn-in pattern can further configure a system monitor in the IC device, and the junction temperature can be measured in the IC device by the system monitor. The burn-in pattern can further configure a thermostat circuit, where the thermostat circuit is configured with the set-point temperature, and where the junction temperature is compared with the set-point temperature using the thermostat circuit. The steps of measuring the junction temperature, comparing the junction temperature to the set-point temperature, and increasing or decreasing the number of enabled heat core circuits can be repeated for a plurality of iterations. Each of the plurality of heat core circuits can include at least one ring oscillator, and the at least one ring oscillator can be enabled in each of the number of the enabled heat core circuits during the measurement period. Each of the number of the enabled heat core circuits can be exclusively enabled for a number of clock cycles during the measurement period. The number of clock cycles for which each of the number of the enabled heat core circuits is exclusively enabled during the measurement period can be the same.

One embodiment of an integrated circuit (IC) includes: a load controller having a plurality of heat core circuits, the plurality of heat core circuits including a number of enabled heat core circuits; a system monitor configured to measure a junction temperature in the IC after a measurement period has elapsed; and a thermostat circuit configured with a set-point temperature and being coupled to the system monitor and the load controller. The thermostat circuit is configured to: compare the junction temperature from the system monitor with the set-point temperature; and increase the number of the enabled heat core circuits in the load controller if the junction temperature is less than the set-point temperature, or decrease the number of the enabled heat core circuits in the load controller if the junction temperature is greater than the set-point temperature.

In this embodiment, the thermostat circuit can comprise a state machine for implementing the compare of the junction temperature with the set-point temperature and the increase or the decrease of the number of the enabled heat core circuits, and a register for storing the set-point temperature. Each of the plurality of heat core circuits can include at least one ring oscillator, and the at least one ring oscillator can be enabled in each of the number of the enabled heat core circuits during the measurement period. The load controller can include a shift register configured to selectively enable the plurality of heat cores based on a binary value stored therein. The binary value in the shift register can be configured to rotate such that each of the number of the enabled heat core circuits is exclusively enabled for a number of clock cycles during the measurement period. The number of clock cycles for which each of the number of the enabled heat core circuits is exclusively enabled during the measurement period can be the same. The IC can include programmable logic, wherein each of the load controller, the thermostat circuit, and the system monitor can be implemented using respective configured portions of the programmable logic.

One embodiment of a method of burn-in for an integrated circuit (IC) having a plurality of heat core circuits, includes: enabling a number of heat core circuits of the plurality of heat core circuits; measuring a junction temperature in the IC; comparing the junction temperature with a set-point temperature; and increasing the number of the enabled heat core circuits if the junction temperature is less than the set-point temperature, or decreasing the number of the enabled heat core circuits if the junction temperature is greater than the set-point temperature.

In this embodiment, the IC can include a system monitor, and the junction temperature can be measured in the IC device by the system monitor after a measurement period. Each of the plurality of heat core circuits can include at least one ring oscillator, and the at least one ring oscillator can be enabled in each of the number of the enabled heat core circuits during the measurement period. Each of the number of the enabled heat core circuits can be exclusively enabled for a number of clock cycles during the measurement period. The number of clock cycles for which each of the number of the enabled heat core circuits is exclusively enabled during the measurement period can be the same. The IC device can include a thermostat circuit, where the thermostat circuit is configured with the set-point temperature, and the junction temperature can be compared with the set-point temperature using the thermostat circuit.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
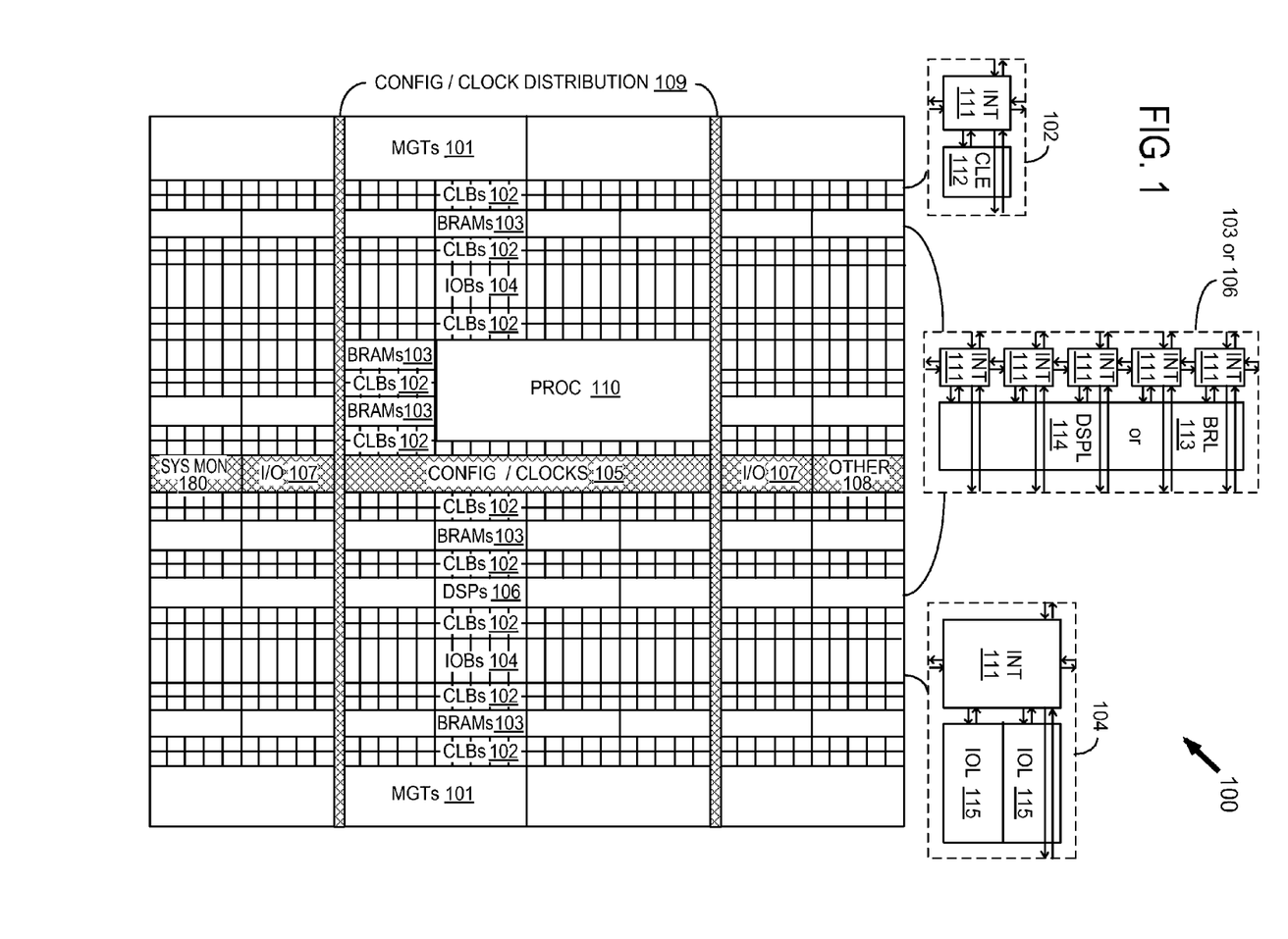
FIG. 1 illustrates an FPGA architecture according to an embodiment of the invention.

FIG. 1 illustrates an FPGA architecture 100 that includes a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., configuration ports and clock ports), and other programmable logic 108 such as digital clock managers, analog-to-digital converters, system monitoring logic, and so forth. A given set of programmable tiles of an FPGA is referred to herein as a programmable fabric of the FPGA. In one embodiment, the FPGA 100 may include a system monitor 180. The system monitor 180 is configured to measure various physical parameters of the FPGA 100, such as supply voltages, junction temperatures, and the like.

In some FPGAs, each programmable tile includes a programmable interconnect element (INT) 111 having standardized connections to and from a corresponding interconnect element in each adjacent tile. Therefore, the programmable interconnect elements taken together implement the programmable interconnect structure for the illustrated FPGA. The INT 111 also includes the connections to and from the programmable logic element within the same tile, as shown by the examples included at the top of FIG. 1.

For example, a CLB 102 can include a configurable logic element (CLE) 112 that can be programmed to implement user logic plus a single INT 111. A BRAM 103 can include a BRAM logic element (BRL) 113 in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL) 114 in addition to an appropriate number of programmable interconnect elements. An IOB 104 can include, for example, two instances of an input/output logic element (IOL) 115 in addition to one instance of the INT 111. As will be clear to those of skill in the art, the actual I/O pads connected, for example, to the I/O logic element 115 are manufactured using metal layered above the various illustrated logic blocks, and typically are not confined to the area of the input/output logic element 115.

The FPGA architecture 100 also includes one or more dedicated processor blocks (PROC) 110. The PROC 110 comprises a microprocessor core, as well as associated control logic. Notably, such a microprocessor core may include embedded hardware or embedded firmware or a combination thereof for a "hard" or "soft" microprocessor. A soft microprocessor may be implemented using the programmable logic (e.g., CLBs, IOBs). For example, a MICROBLAZE soft microprocessor, available from Xilinx of San Jose, Calif., may be employed. A hard microprocessor may be implemented using an IBM POWER PC available from International Business Machines ("IBM®") Corporation of Armonk, N.Y. The processor block 110 is coupled to the programmable logic of the FPGA in a well known manner.

In the pictured embodiment, a columnar area near the center of the die is used for configuration, clock, and other control logic. Horizontal areas 109 extending from this column are used to distribute the clocks and configuration signals across the breadth of the FPGA. In other embodiments, the configuration logic may be located in different areas of the FPGA die, such as in the corners of the FPGA die. Configuration information for the programmable logic is stored in configuration memory. The configuration logic 105 provides an interface to, and loads configuration data to, the configuration memory. A stream of configuration data ("configuration bitstream") may be coupled to the configuration logic 105, which in turn loads the configuration memory.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/ logic implementations as well as the location of the blocks within the array included at the top of FIG. 1 are purely exemplary. For example, in an actual FPGA more than one adjacent column of CLBs is typically included wherever the CLBs appear, to facilitate the efficient implementation of user logic.

Figure 2:
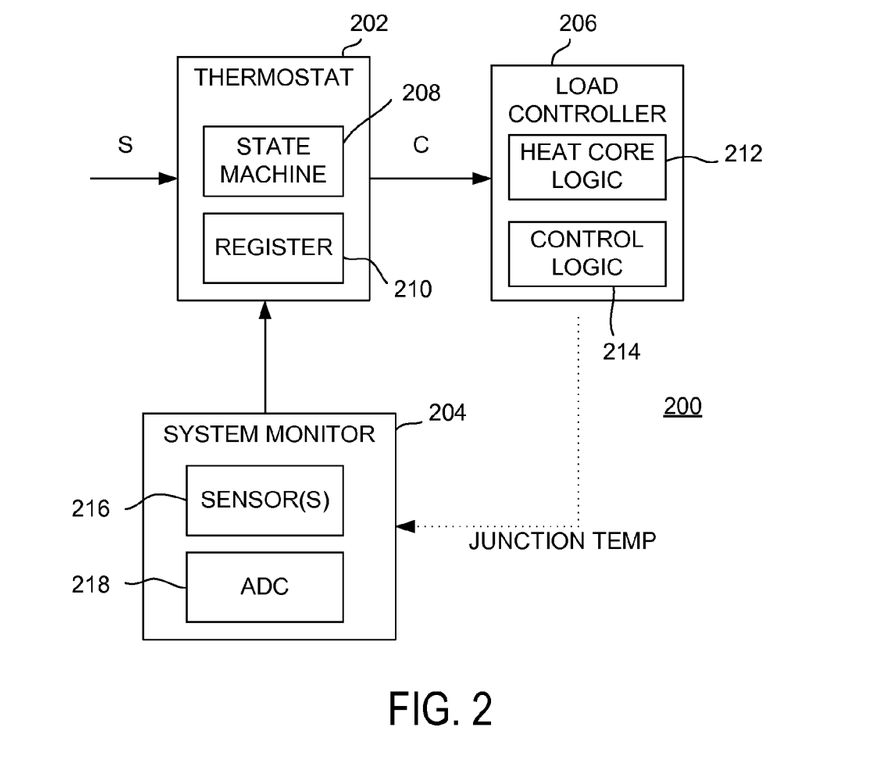
FIG. 2 is a block diagram depicting the thermostat controller for using an integrated circuit according to an embodiment of the invention.

FIG. 2 is a block diagram depicting the thermostat controller 200 for using an integrated circuit according to an embodiment of the invention. For example, the thermostat controller 200 may be programmed into the FPGA 100 to implement burn-in logic. It is to be understood that the thermostat controller 200 may be used as burn-in logic for other types of known ICs in addition to FPGAs.

The thermostat controller 200 includes a thermostat circuit 202, a system monitor 204, and a load controller 206. An input of the thermostat circuit 202 is configured to receive a set-point temperature signal, S. Another input of the thermostat circuit 202 is coupled to an output of the system monitor 204. An output of the thermostat circuit 202 is coupled to an input of the load controller 206. In general operation, the load controller 206 includes circuitry that, when powered, generates heat according to a selectable effort level. The system monitor 204 periodically measures a junction temperature of the IC. Hence, the load controller 206 and the system monitor 204 are effectively linked by the junction temperature. The thermostat circuit 202 compares the junction temperature as measured by the system monitor with the set-point temperature. If the measured junction temperature is less than the set-point temperature, the thermostat circuit 202 increases the effort level of the load controller 206. An increase in the effort level of the load controller 206 results in an increase in generated heat. If the measured junction temperature is greater than the set-point temperature, the thermostat circuit 202 decreases the effort level of the load controller 206. A decrease in the effort level of the load controller 206 results in a decrease in generated heat.

In this embodiment, the thermostat circuit 202 includes a state machine 208 and a register 210. The register 210 is configured to store a value of the set-point temperature, as provided by the signal S. The state machine 208 is configured to implement the following functionality: (1) compares a measured junction temperature with the set-point temperature; and (2) generate a control signal, C, to control the load controller 206 to increase the effort level if the measured junction temperature is less than the set-point temperature, or decrease the effort level if the measured junction temperature is greater than the set-point temperature. The state machine 208 can implement the compare and control functionality for multiple iterations, each iteration based on a new measured junction temperature from the system monitor 204. The state machine 208 may be implemented using various logic elements, such as logic gates, memories, processors, and the like.

In this embodiment, the load controller 206 includes heat core logic 212 and control logic 214. The heat core logic 212 includes a selectable range of efforts between a lowest effort and a highest effort. At the lowest effort, the heat core logic 212 consumes power such that a lowest amount of heat is generated. At the highest effort, the heat core logic 212 consumes power such that a highest amount of heat is generated. The heat core logic 212 may include any number of effort levels between the lowest effort level and the highest effort level. The control logic 214 is configured to receive the control signal C from the thermostat circuit 202. The control logic 214 controls the heat core logic 212 to have a particular effort level based on a value provided in the control signal C from the thermostat circuit 202. An exemplary embodiment of the load controller 206 is described below.

In this embodiment, the system monitor 204 includes one or more sensors 216 and an analog-to-digital converter (ADC) 218. The sensor(s) 216 are configured to measure various physical operating parameters of the IC, such as power supply voltages, junction temperatures, and the like. The ADC 218 is configured to receive analog output from the sensor(s) 216 and generate digital output representative of the analog output. In this manner, the system monitor 204 can measure junction temperature of IC die (also referred to as die temperature) and can provide a digital representation of such junction temperature to the thermostat circuit 202. An exemplary system monitor that can be used with the invention is described in the "VIRTEX 5 FPGA System Monitor User Guide," ver. 1.7, 11-Mar.-2009, published by Xilinx, Inc. and incorporated by reference herein.

The thermostat circuit 202 may be configured to periodically compare junction temperature to the set-point temperature and generate the control signal C accordingly. The junction temperature is measured and used in the comparison after a measurement period has elapsed. In this embodiment, the system monitor 204 can provide the junction temperature after each measurement period has elapsed. Alternatively, the system monitor 204 can continuously provide the junction temperature to the thermostat circuit 202, which in turn performs the comparison with the set-point temperature after each measurement period has elapsed.

In operation, the thermostat controller 200 is powered and the thermostat circuit 202 is initially set with a set-point temperature. Once configured with a set-point temperature, the thermostat circuit 202 will control the load controller 206 with an appropriate effort level for each measurement cycle, as described above. This operation can continue for a burn-in period, after which power can be removed from the thermostat controller 200. In this manner, the thermostat controller 200 provides over an "ovenless" burn-in of the IC using internal heat logic. The thermostat controller 200 employs self-regulated temperature control and can maintain the same desired burn-in temperature for any number of ICs under test. The overall feedback-loop design of the thermostat circuit 202, the load controller 206, and the system monitor 204 provides for precise junction temperature control during burn-in.

The thermostat controller 200 can be implemented in an FPGA. The FPGA may include various programmable logic as noted above. The programmable logic can be coupled to the system monitor 204, which is implemented on the FPGA. The thermostat circuit 202 and the load controller 206 can be implemented in the FPGA using the programmable logic. For example, the FPGA can be configured with a burn-in pattern, which in turn arranges portions of the programmable logic to generate the thermostat circuit 202 and the load controller 206. In this manner, the thermostat controller 200 can provide an "oven-less" burn-in for an FPGA using the programmable nature thereof.

Although separate functional blocks are shown for the thermostat circuit 202, the system monitor 204, and the load controller 206, it is to be understood that the thermostat controller 200 may implement the functionalities described herein using one or more functional blocks. For example, the functions of the thermostat circuit 202 and the load controller 206 can be combined and considered a single block from a logical viewpoint.

Figure 3:
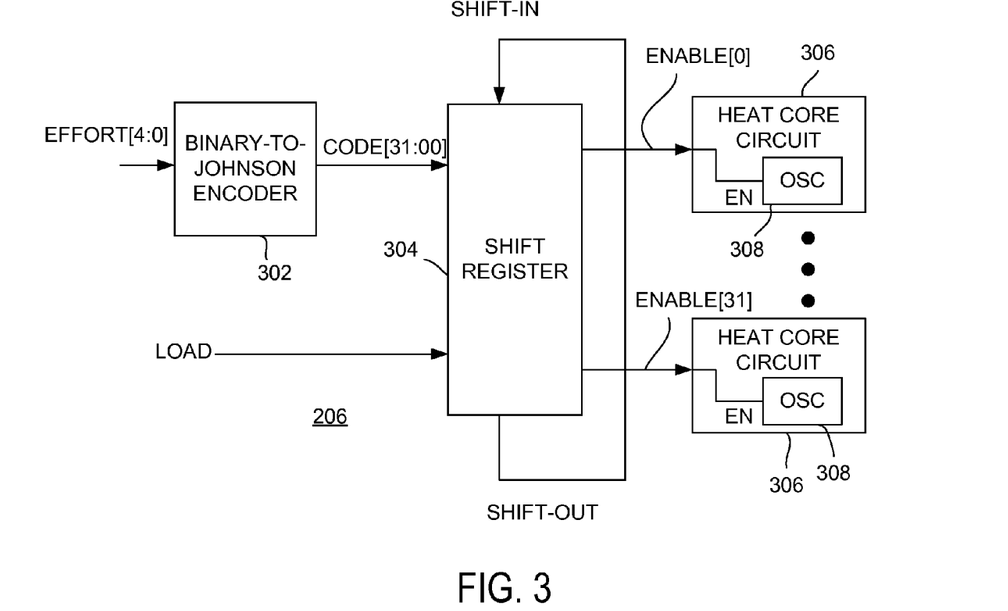
FIG. 3 is a block diagram depicting the load controller according to an embodiment of the invention.

FIG. 3 is a block diagram depicting the load controller 206 according to an embodiment of the invention. The load controller 206 can include a binary-to-Johnson encoder 302, a shift register 304, and a plurality of heat core circuits 306. The control signal C provided by the thermostat circuit 202 includes an effort signal and a load signal. An input of the binary-to-Johnson encoder 302 receives the effort signal. An output of the binary-to-Johnson encoder 302 is coupled to a data input of the shift register 304 (referred to as the code signal). A control input of the shift register 304 receives the load signal. The shift register 304 is configured to store multiple bits (e.g., 32 bits). The shift register 304 includes a shift-input for serially shifting in a bit, and a shift-output for serially shifting out a bit. The shift-output of the shift register 304 is coupled to its shift-input. A data output of the shift register 304 is coupled to enable inputs of the heat core circuits 306 (referred to as the enable signal). In particular, each of the heat core circuits 306 is configured to receive the value of a respective one of the bits stored in the shift register 304. For example, the shift register 304 can store 32 bits for controlling a respective 32 heat core circuits 306.

Each of the heat core circuits 306 includes digital oscillator logic 308 having an enable input configured to receive a bit from the shift register 304. When enabled, the oscillator logic 308 causes one or more oscillations between logic low and logic high. The oscillation(s) cause the oscillator logic 308 to consume power, which in turn generates some amount of heat in the IC. When disabled, the oscillator logic 308 is static without oscillation(s) and consumes little or no power. Thus, only those heat core circuits 306 that are enabled significantly contribute to heat generation in the IC. The heat core circuits 306 can be distributed throughout the IC in a manner that provides even heating of the IC die.

Figure 4:
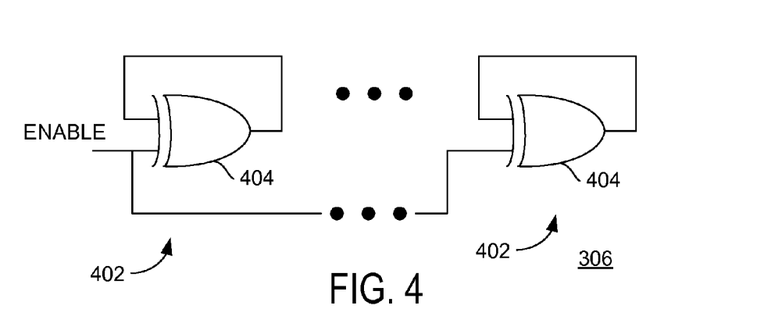
FIG. 4 is a block diagram depicting a heat core circuit according to an embodiment of the invention.

FIG. 4 is a block diagram depicting a heat core circuit 306 according to an embodiment of the invention. The heat core circuit 306 includes one or more ring oscillators 402. Each of the ring oscillators 402 includes an exclusive-OR (XOR) gate 404 having two inputs and an output. One input of the XOR gate 404 receives an enable signal, and another input of the XOR gate 404 is coupled to its output. Thus, if the enable input receives a logic high, then the output of the XOR gate 404 inverts its feedback, causing oscillation between logic high and logic low. For example, the frequency of oscillation can be at or near the gigahertz range, depending on the specific circuitry used to implement the XOR gate 404. High frequencies are desirable, because such high frequency oscillations can be more quickly attenuated by on-chip filtering. When the enable input of the XOR gate 404 receives a logic low, the output of the XOR gate 404 will not toggle and remain static. If the heat core circuit 306 includes multiple ring oscillators 402, the enable inputs thereof may be tied together to provide a single enable input for the heat core circuit 306.

The heat core circuit 306 can be implemented using programmable logic of an FPGA. The ring oscillator(s) 402 can be implemented using one or more CLBs of the FPGA. If multiple ring oscillators 402 are present, then each of the ring oscillators 402 toggles at a slightly different frequency, depending on placement and routing of the feedback path. Such a configuration promotes even power draw by the ring oscillators 402.

Returning to FIG. 3, for purposes of clarity by example, assume there are 32 heat core circuits 306. It is to be understood that more or less heat circuits 306 can be employed. Given 32 heat circuits 306, the shift register 304 can be a 32-bit shift register. The effort signal can include five bits (e.g., effort[4:0]) providing for 32 different effort levels selectable by the thermostat circuit 202. The binary-to-Johnson encoder 302 is configured to map the 5-bit binary effort signal to a 32-bit Johnson-encoded signal. For example, the binary-to-Johnson encoder 302 can take a value of the 5-bit binary effort signal and set a predefined number of bits of a 32-bit code. Such an encoding of a binary signal may be referred to as a "Johnson code". The number of bits set in the 32-bit will equate to the number of enabled heat core circuits 306.

For example, a binary 00101 (decimal 5) can be mapped to 0000 0000 0000 0000 0000 0000 0001 1111 (five set bits out of 32 bits). Generalizing such a mapping would allow any number of enabled heat core circuits 306 between 0 and 31. Note this is just one possible mapping. For example, the binary-to-Johnson encoder 302 may be designed such that binary 00000 is mapped to 0000 0000 0000 0000 0000 0000 0000 0001. Generalizing such a mapping would allow any number of enabled heat core circuits 306 between 1 and 32. Note further that the above Johnson codes are merely exemplary, as different sets of bits may be set (e.g., a binary 00101 may be mapped to 1111 1000 0000 0000 0000 0000 0000 0000). In general function, the binary-to-Johnson encoder 302 reads the binary effort signal and sets a corresponding number of bits in the 32-bit code in order to enable an equal number of heat core circuits 306.

The output of the binary-to-Johnson encoder 302 is stored in the shift register 304 in response to assertion of the load signal. The thermostat circuit 202 can assert the load signal to cause the shift register 304 to be loaded with the selected effort level. When the load signal is de-asserted, the 32-bit code rotates around the shift register 304 as bits are shifted out and fed back to the input. Each bit of the shift register 304 controls a respective one of the heat core circuits 306. Thus, as the 32-bit code rotates around the shift register 304, different ones of the heat core circuits 306 (assuming not all are enabled) are enabled and then disabled. Thus, each of the heat core circuits 306 spends the same number of clock cycles in the enabled state, thereby providing for even heating of the IC.

While aspects of FIG. 3 relate to 32 heat core circuits, 32-bit shift register, and a 5-bit effort signal, it is to be understood that other values may be employed. For example, more or less heat core circuits can be used, with more or less bit capacity of the shift register, with more or less bits of the effort signal and corresponding code signal.

Figure 5:
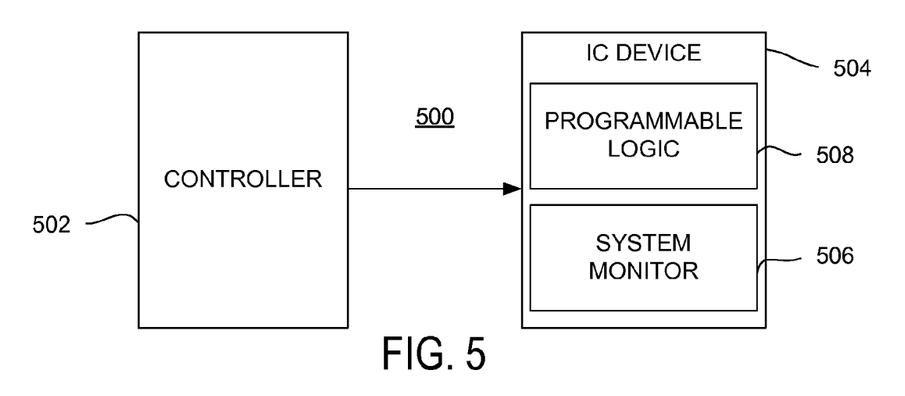
FIG. 5 is a block diagram depicting a burn-in system for an IC device according to an embodiment of the invention.

FIG. 5 is a block diagram depicting a burn-in system 500 for an IC device according to an embodiment of the invention. The burn-in system 500 includes a controller 502 coupled to an IC device 504. The IC device 504 includes a system monitor 506 and programmable resources such as, e.g., programmable logic 508. The system monitor 506 operates as system monitors described above to measure junction temperature of the IC device 504. The programmable logic 508 is capable of being programmed to implement various circuitry, e.g., the FPGA architecture 100 of FIG. 1. The controller 502 is configured to load a burn-in pattern to the IC device 504 in order to configure the programmable logic 508. The burn-in pattern is designed to configure a thermostat controller as described above into the programmable logic 508.

Figure 6:
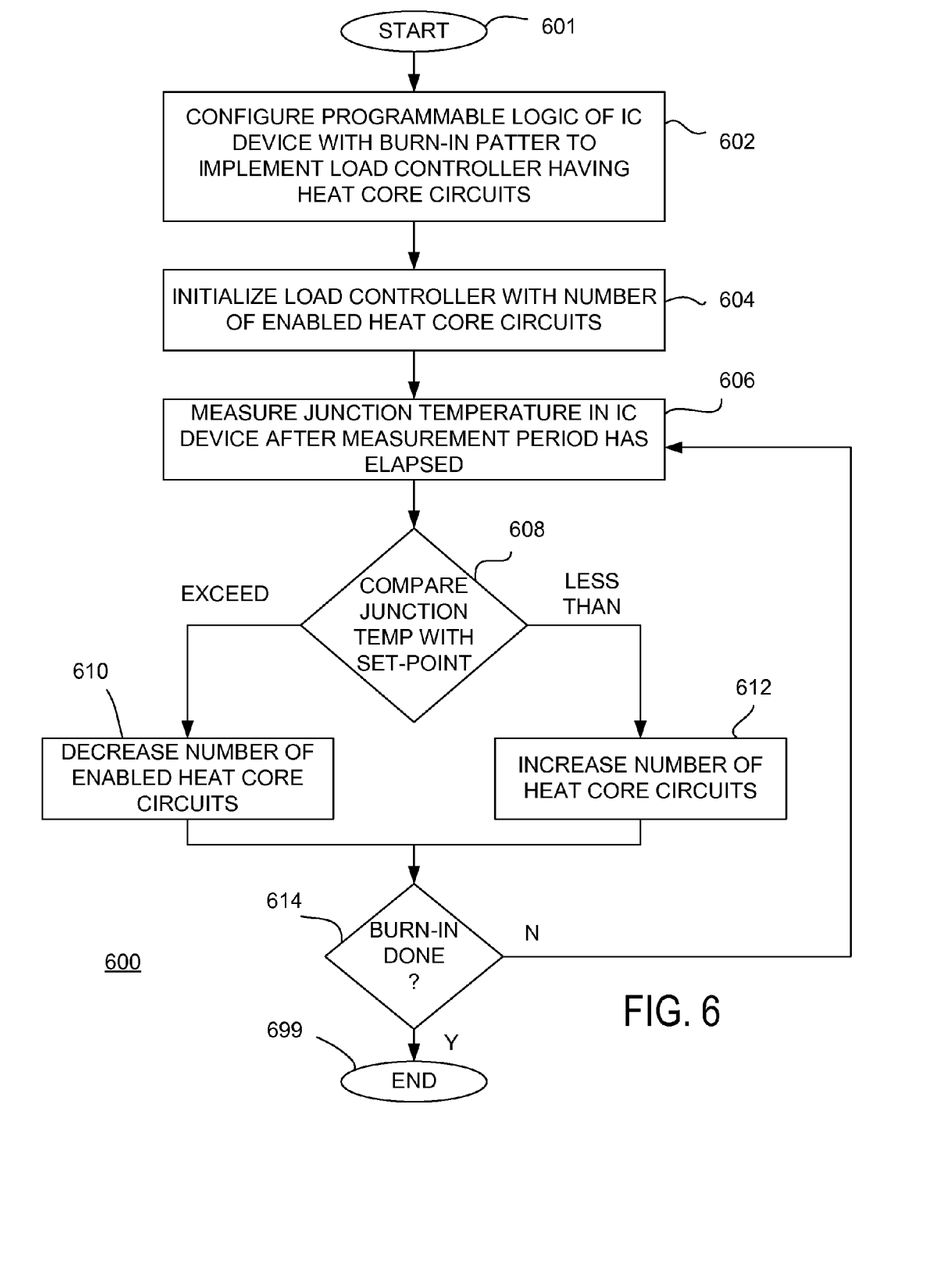
FIG. 6 is a flow diagram depicting a method of burn-in for an IC device according to an embodiment of the invention.

FIG. 6 is a flow diagram depicting a method 600 of burn-in for an IC device according to an embodiment of the invention. The method 600 may be performed by the burn-in system 500 shown in FIG. 5. The method 600 begins at step 601. At step 602, programmable logic of the IC device is configured with a burn-in pattern to implement a load controller having a plurality of heat core circuits (e.g., using the controller 502). At step 604, the load controller is initialized with a number of enabled heat core circuits. For example, the burn-in pattern may dictate an initial number of enabled heat core circuits. At step 606, a junction temperature in the IC device is measured after a measurement period has elapsed (e.g., a certain time period after the enabled heat core circuits have been operating). The junction temperature may be measured using a system monitor or similar type logic, as described above. At step 608, the junction temperature is compared with a set-point temperature. If the junction temperature exceeds the set-point temperature, the method 600 proceeds to step 610. Otherwise, the method 600 proceeds to step 612. The comparison of junction temperature and set-point temperature may be performed by the load controller or using a separate thermostat circuit, as described above.

At step 610, since the junction temperature exceeds the set point temperature, the number of enabled heat core circuits is decreased. Decreasing the number or enabled heat core circuits leads to a decrease in junction temperature. At step 612, since the junction temperature is less than the set-point temperature, the number of enabled heat core circuits is increased. Increasing the number of enabled heat core circuits leads to an increase in junction temperature.

At step 614, a determination is made whether burn-in time has elapsed. If not, the method 600 returns to step 606 and repeats. Otherwise, the method 600 ends at step 699.

Method and apparatus for burn-in of an IC device have been described. One or more embodiments of the invention implement an ovenless burn-in using internal heat elements. Instead of relying on external air flow, heat is generated internally using heat elements without requiring relatively large equipment, such as a burn-in chamber, heating modules, cooling modules, etc. For FPGA or similar type of programmable devices, the configurable nature of the device can be leveraged to implement burn-in without having several built-in, dedicated circuit elements.

In addition, precise temperature control is maintained using a feedback loop design. As opposed to temperature fluctuation observed in conventional burn-in systems that use chambers and air-flow, one or more embodiments of the invention provide precise control of temperature through the burn-in test. Such superior performance is achieved by feedback loop design that monitors and regulates temperature of the device at a desired frequency (e.g., every 500 milliseconds).

In addition, part-to-part variation is reduced or eliminated. Using one or embodiments of the invention, the devices under test are being stressed at the same desired temperature during burn-in regardless of the power consumption of each unit. Thus, part-to-part variation of temperature among the tested devices is reduced or eliminated, when compared to a traditional burn-in chamber. Such significant improvement is achieved by self-regulated burn-in that regulates junction temperature independently for each IC device under test.

Furthermore, since the junction temperature of each IC device is directly measured in one or more embodiments of the invention, it is not necessary to estimate junction temperature based on total power consumption or package case temperature. This improves accuracy of acceleration calculation, allowing test engineers to improve performance guard bands to improve yield, while guaranteeing IC device performance at the end of a desired lifetime (e.g., 10 years).

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

The invention claimed is:

1. A method of burn-in for an integrated circuit (IC), comprising:
    configuring programmable resources of the IC based on a burn-in pattern to implement a load controller, the load controller having a plurality of heat core circuits;
    initializing the load controller with a number of enabled heat core circuits of the plurality of heat core circuits;
    measuring a junction temperature in the IC after a measurement period has elapsed;
    comparing the junction temperature with a set-point temperature; and
    increasing the number of the enabled heat core circuits if the junction temperature is less than the set-point temperature, or decreasing the number of the enabled heat core circuits if the junction temperature is greater than the set-point temperature.

2. The method of claim 1, wherein the burn-in pattern further configures a system monitor in the IC, and wherein the junction temperature is measured in the IC by the system monitor.

3. The method of claim 1, wherein the burn-in pattern is further configured to implement a thermostat circuit, the thermostat circuit being configured with the set-point temperature, and wherein the junction temperature is compared with the set-point temperature using the thermostat circuit.

4. The method of claim 1, further comprising:
    repeating the steps of measuring, comparing, and increasing or decreasing for a plurality of iterations.

5. The method of claim 1, wherein each of the plurality of heat core circuits includes at least one ring oscillator, and wherein the at least one ring oscillator is enabled in each of the number of the enabled heat core circuits during the measurement period.

6. The method of claim 1, wherein each of the enabled heat core circuits is exclusively enabled for a number of clock cycles during the measurement period.

7. The method of claim 1, wherein the number of clock cycles for which each of the enabled heat core circuits is exclusively enabled during the measurement period is the same.

8. An integrated circuit (IC), comprising:
    a load controller having a plurality of heat core circuits, the plurality of heat core circuits including a number of enabled heat core circuits;
    a system monitor configured to measure a junction temperature in the IC after a measurement period has elapsed; and
    a thermostat circuit configured with a set-point temperature and being coupled to the system monitor and the load controller, the thermostat circuit configured to:
    compare the junction temperature from the system monitor with the set-point temperature; and
    increase the number of the enabled heat core circuits in the load controller if the junction temperature is less than the set-point temperature, or decrease the number of the enabled heat core circuits in the load controller if the junction temperature is greater than the set-point temperature.

9. The IC of claim 8, wherein the thermostat circuit comprises a state machine for implementing the compare of the junction temperature with the set-point temperature and the increase or the decrease of the number of the enabled heat core circuits, and a register for storing the set-point temperature.

10. The IC of claim 8, wherein each of the plurality of heat core circuits includes at least one ring oscillator, and wherein the at least one ring oscillator is enabled in each of the number of the enabled heat core circuits during the measurement period.

11. The IC of claim 8, wherein the load controller includes a shift register configured to selectively enable the plurality of heat cores based on a binary value stored therein.

12. The IC of claim 11, wherein the binary value in the shift register is configured to rotate such that each of the enabled heat core circuits is exclusively enabled for a number of clock cycles during the measurement period.

13. The IC of claim 12, wherein the number of clock cycles for which each of the enabled heat core circuits is exclusively enabled during the measurement period is the same.

14. The IC of claim 8, further comprising:
   programmable logic, wherein each of the load controller, the thermostat circuit, and the system monitor is implemented using respective configured portions of the programmable logic.

15. A method of burn-in for an integrated circuit (IC) having a plurality of heat core circuits, the method comprising:
   enabling a number of heat core circuits of the plurality of heat core circuits;
   measuring a junction temperature in the IC;
   comparing the junction temperature with a set-point temperature; and
   increasing the number of the enabled heat core circuits if the junction temperature is less than the set-point temperature, or decreasing the number of the enabled heat core circuits if the junction temperature is greater than the set-point temperature.

16. The method of claim 15, wherein the IC includes a system monitor, and wherein the junction temperature is measured in the IC by the system monitor after a measurement period.

17. The method of claim 16, wherein each of the plurality of heat core circuits includes at least one ring oscillator, and wherein the at least one ring oscillator is enabled in each of the number of the enabled heat core circuits during the measurement period.

18. The method of claim 16, wherein each of the number of the enabled heat core circuits is exclusively enabled for a number of clock cycles during the measurement period.

19. The method of claim 18, wherein the number of clock cycles for which each of the enabled heat core circuits is exclusively enabled during the measurement period is the same.

20. The method of claim 15, wherein the IC includes a thermostat circuit, wherein the thermostat circuit is configured with the set-point temperature, and wherein the junction temperature is compared with the set-point temperature using the thermostat circuit.

* * * * *